(12) United States Patent
Shih et al.

(10) Patent No.: US 8,623,760 B2
(45) Date of Patent: *Jan. 7, 2014

(54) PROCESS FOR IMPROVING COPPER LINE CAP FORMATION

(75) Inventors: Chien-Hsueh Shih, Taipei (TW);
Minghsing Tsai, Chu-Pei (TW);
Chen-Hua Yu, Hsin-Chu (TW);
Ming-Shih Yeh, Chupei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/440,704

(22) Filed: Apr. 5, 2012

(65) Prior Publication Data

US 2012/0190191 A1 Jul. 26, 2012

Related U.S. Application Data

(63) Continuation of application No. 11/605,893, filed on Nov. 28, 2006, now Pat. No. 8,193,087.

(60) Provisional application No. 60/801,489, filed on May 18, 2006.

(51) Int. Cl.
*H01L 21/768* (2006.01)

(52) U.S. Cl.
USPC ........................................... 438/643

(58) Field of Classification Search
USPC .................. 438/643; 257/E21.584
See application file for complete search history.

(56) References Cited

U.S. PATENT DOCUMENTS

| 5,382,447 | A |   | 1/1995  | Kaja et al.              |
|-----------|---|---|---------|--------------------------|
| 5,753,309 | A |   | 5/1998  | Fakler et al.            |
| 5,889,328 | A |   | 3/1999  | Joshi et al.             |
| 6,130,157 | A | * | 10/2000 | Liu et al. ........ 438/669 |
| 6,130,161 | A |   | 10/2000 | Ashley et al.            |

(Continued)

FOREIGN PATENT DOCUMENTS

| CN | 1369112 A | 9/2002 |
| CN | 1473207 A | 2/2004 |

(Continued)

OTHER PUBLICATIONS

Naik, M., et al., "Process Development and Integration of Electroless Cobalt Cap with Low k Carbon Doped Oxide," Proceedings of the IEEE 2005 International Interconnect Technology Conference, Jun. 6-8, 2005, pp. 24-26.

*Primary Examiner* — Walter H Swanson
(74) *Attorney, Agent, or Firm* — Slater & Matsil, L.L.P.

(57) ABSTRACT

An integrated circuit includes a semiconductor substrate, a low-k dielectric layer over the semiconductor substrate, a first opening in the low-k dielectric layer, and a first diffusion barrier layer in the first opening covering the low-k dielectric layer in the first opening, wherein the first diffusion barrier layer has a bottom portion connected to sidewall portions, and wherein the sidewall portions have top surfaces close to a top surface of the low-k dielectric layer. The integrated circuit further includes a conductive line filling the first opening wherein the conductive line has a top surface lower than the top surfaces of the sidewall portions of the diffusion barrier layer, and a metal cap on the conductive line and only within a region directly over the conductive line.

16 Claims, 5 Drawing Sheets

(56) References Cited

U.S. PATENT DOCUMENTS

| | | |
|---|---|---|
| 6,147,402 A | 11/2000 | Joshi et al. |
| 6,207,552 B1 | 3/2001 | Wang et al. |
| 6,214,728 B1 | 4/2001 | Chan et al. |
| 6,259,160 B1 | 7/2001 | Lopatin et al. |
| 6,274,499 B1 | 8/2001 | Gupta et al. |
| 6,287,954 B1 | 9/2001 | Ashley et al. |
| 6,291,333 B1 | 9/2001 | Lou |
| 6,294,836 B1 | 9/2001 | Paranjpe et al. |
| 6,323,128 B1 | 11/2001 | Sambucetti et al. |
| 6,329,701 B1 | 12/2001 | Ngo et al. |
| 6,348,731 B1 | 2/2002 | Ashley et al. |
| 6,358,832 B1 | 3/2002 | Edelstein et al. |
| 6,365,502 B1 | 4/2002 | Paranjpe et al. |
| 6,395,607 B1 | 5/2002 | Chung |
| 6,475,909 B2 | 11/2002 | Uozumi |
| 6,504,247 B2 | 1/2003 | Chung |
| 6,573,606 B2 | 6/2003 | Sambucetti et al. |
| 6,616,976 B2 | 9/2003 | Montano et al. |
| 6,645,847 B2 | 11/2003 | Paranjpe et al. |
| 6,670,274 B1 | 12/2003 | Liu et al. |
| 6,696,761 B2 | 2/2004 | Chan et al. |
| 6,706,625 B1 | 3/2004 | Sudijono et al. |
| 6,709,874 B2 | 3/2004 | Ning |
| 6,717,189 B2 | 4/2004 | Inoue et al. |
| 6,812,126 B1 | 11/2004 | Paranjpe et al. |
| 6,821,902 B2 | 11/2004 | Inoue et al. |
| 6,844,258 B1 | 1/2005 | Fair et al. |
| 6,858,527 B2 | 2/2005 | Gracias |
| 6,864,169 B2 | 3/2005 | Noguchi et al. |
| 6,878,632 B2 | 4/2005 | Nogami et al. |
| 6,962,873 B1 | 11/2005 | Park |
| 6,975,032 B2 | 12/2005 | Chen et al. |
| 7,338,908 B1 | 3/2008 | Koos et al. |
| 2001/0034125 A1 | 10/2001 | Uozumi |
| 2002/0086487 A1 | 7/2002 | Chung |
| 2002/0106458 A1 | 8/2002 | Montano et al. |
| 2002/0185658 A1 | 12/2002 | Inoue et al. |
| 2003/0183940 A1 | 10/2003 | Noguchi et al. |
| 2004/0086646 A1 | 5/2004 | Brandes et al. |
| 2004/0113277 A1 | 6/2004 | Chiras et al. |
| 2004/0113279 A1 | 6/2004 | Chen et al. |
| 2004/0121583 A1 | 6/2004 | Bao et al. |
| 2005/0064700 A1 | 3/2005 | Uozumi et al. |
| 2006/0148255 A1 | 7/2006 | Lu et al. |
| 2006/0205204 A1 | 9/2006 | Beck |
| 2007/0228571 A1 | 10/2007 | Yu et al. |
| 2007/0249156 A1 | 10/2007 | Bonilla et al. |

FOREIGN PATENT DOCUMENTS

| | | |
|---|---|---|
| CN | 1507047 A | 6/2004 |
| CN | 1547245 A | 11/2004 |
| JP | 2005-072228 | 3/2005 |
| KR | 10-2000-0044554 A | 7/2000 |
| KR | 10-2003-0095189 A | 12/2003 |

\* cited by examiner

PROCESS FOR IMPROVING COPPER LINE CAP FORMATION

This application is a continuation of U.S. patent application Ser. No. 11/605,893, filed on Nov. 28, 2006, entitled "Process for Improving Copper Line Cap Formation," which claims the benefit of U.S. Provisional Application No. 60/801,489, filed on May 18, 2006, entitled "Process for Improving Copper Line Cap Formation;" which applications are hereby incorporated herein by reference in their entireties.

TECHNICAL FIELD

This invention relates generally to metallization of an integrated circuit, and more specifically to the formation methods of interconnect structures.

BACKGROUND

A conventional integrated circuit contains a plurality of patterns of metal lines separated by inter-wiring spacings, and a plurality of interconnect lines, such as bus lines, bit lines, word lines and logic interconnect lines. Typically, the metal patterns of vertically spaced metallization layers are electrically interconnected by vias. Metal lines formed in trench-like openings typically extend substantially parallel to the semiconductor substrate. Semiconductor devices of this type, according to current technology, may comprise eight or more levels of metallization to satisfy device geometry and micro-miniaturization requirements.

A common method for forming metal lines is known as "damascene." Generally, this process involves forming an opening in the dielectric interlayer, which separates the vertically spaced metallization layers. The opening is typically formed using conventional lithographic and etching techniques. After an opening is formed, the opening is filled with copper or copper alloys to form a metal line and/or a via. Excess metal material on the surface of the dielectric interlayer is then removed by chemical mechanical polish (CMP). Although copper has low resistivity and high reliability, copper still suffers from electro-migration (EM) and stress-migration (SM) reliability issues as geometries continue to shrink and current densities increase. Various approaches are thus explored to solve these problems.

FIG. 1 illustrates a conventional interconnect structure. Two copper lines 2 and 4, are formed adjacent to each other and are insulated from low-k dielectric layer 14 by diffusion barrier layers 6 and 8, respectively. Metal caps 10 and 12, which are typically formed of materials suffering less from electro-migration, are formed on copper lines 2 and 4, respectively. The formation of metal caps greatly improves the reliability of the integrated circuit by reducing the surface migration of the copper lines. It has been found that under stressed conditions, the mean time to failure (MTTF) of the illustrated interconnection structure may be ten times longer than that of an interconnect structure having no metal caps. Part of the reason for the improvement is the reduction of electro-migration. With the metal caps, stress-induced void formation is also significantly reduced.

The introduction of metal caps generates another problem, however. Metal caps are typically formed on copper lines, thus increasing the height of the conductive materials. For example, the formation of metal caps 10 and 12 increases the height of the conductive materials from H' to H. The parasitic capacitance between copper lines 2 and 4 (as well as the conductive materials surrounding copper lines 2 and 4) form a parasitic capacitor, and the capacitance is proportional to the cross-sectional area of lines 2 and 4. Therefore, the formation of metal caps causes the parasitic capacitance to be H/H' times the capacitance with no metal caps formed. As a result, RC delay of the integrated circuit is increased.

An additional effect caused by the formation of metal caps 10 and 12 is the increase in leakage current. Conventionally, metal caps 10 and 12 extend from copper lines 2 and 4 onto top edges of diffusion barrier layers 6 and 8. This increases the leakage current between metal caps 10 and 12, partially due to the higher conductivity of metal caps 10 and 12 compared to the conductivity of the diffusion barrier layers 6 and 8.

In order to reduce parasitic capacitance and leakage current between neighboring conductive features, a new method of forming interconnection structures is needed.

SUMMARY OF THE INVENTION

In accordance with one aspect of the present invention, a method of forming an integrated circuit includes providing a semiconductor substrate, forming a low-k dielectric layer over the semiconductor substrate, forming an opening extending from a top surface of the low-k dielectric layer into the low-k dielectric layer, forming a diffusion barrier layer in the opening covering the low-k dielectric layer in the opening wherein the diffusion barrier layer has a top edge substantially level with a top surface of the low-k dielectric layer, filling a copper line into the opening, recessing a top surface of the copper line, and forming a metal cap on the copper line using a selective deposition method wherein the metal cap is only formed substantially within a region directly over the copper line.

In accordance with another aspect of the present invention, a method of forming an integrated circuit includes providing a semiconductor substrate, forming a low-k dielectric layer over the semiconductor substrate, forming an opening extending from a top surface of the low-k dielectric layer into the low-k dielectric layer, forming a diffusion barrier layer in the opening and covering the low-k dielectric layer in the opening, filling copper into the opening, planarizing the copper to form a copper line, oxidizing a top layer of the copper line to form a copper oxide layer, removing the copper oxide layer, and forming a metal cap on the copper line.

In accordance with yet another aspect of the present invention, an integrated circuit includes a semiconductor substrate, a low-k dielectric layer over the semiconductor substrate, a first opening in the low-k dielectric layer, and a first diffusion barrier layer in the first opening and covering the low-k dielectric layer in the first opening, wherein the first diffusion barrier layer has a bottom portion connected to sidewall portions, and wherein the sidewall portions have top surfaces close to a top surface of the low-k dielectric layer. The integrated circuit further includes a conductive line filling the first opening wherein the conductive line has a top surface lower than the top surfaces of the sidewall portions of the diffusion barrier layer, and a metal cap on the conductive line and only within a region directly over the conductive line.

In accordance with yet another aspect of the present invention, an integrated circuit includes a semiconductor substrate, a low-k dielectric layer over the semiconductor substrate, a diffusion barrier layer, a metal cap, a copper line in the low-k dielectric layer, wherein the copper line is enclosed by the diffusion barrier layer from the sides and the bottom and by the metal cap from the top, and wherein the copper line has a top surface lower than a top edge of the diffusion barrier layer. The metal cap is substantially limited to a region directly over the copper line and is not extended to a region directly over the top edge of the diffusion barrier layer.

In accordance with yet another aspect of the present invention, an integrated circuit includes a semiconductor substrate, a low-k dielectric layer over the semiconductor substrate, a first copper line in the low-k dielectric layer, and a first diffusion barrier layer separating the first copper line and the low-k dielectric layer from the sides and the bottom, wherein a top surface of the first copper line is recessed from a top edge of the first diffusion barrier layer to form a first recess. The integrated circuit further includes a first metal cap covering and at least partially filling the first recess wherein the first metal cap is substantially within a region directly over the first copper line, a second copper line in the low-k dielectric layer, a second diffusion barrier layer separating the second copper line and the low-k dielectric layer from the sides and the bottom, wherein a top surface of the second copper line is recessed from a top edge of the second diffusion barrier layer to have a second recess, and wherein the first and the second diffusion barrier layers have a spacing, and a second metal cap covering and at least partially filling the second recess, wherein the second metal cap is substantially within a region directly over the second copper line.

The advantageous features of the present invention include reduced parasitic capacitances and reduced leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
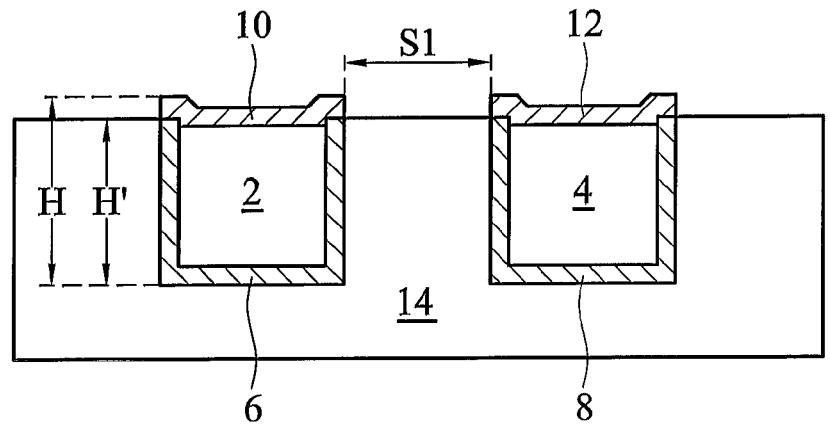
FIG. 1 illustrates a conventional interconnect structure, wherein metal caps extend onto top edges of the respective diffusion barrier layers.
Figure 2:
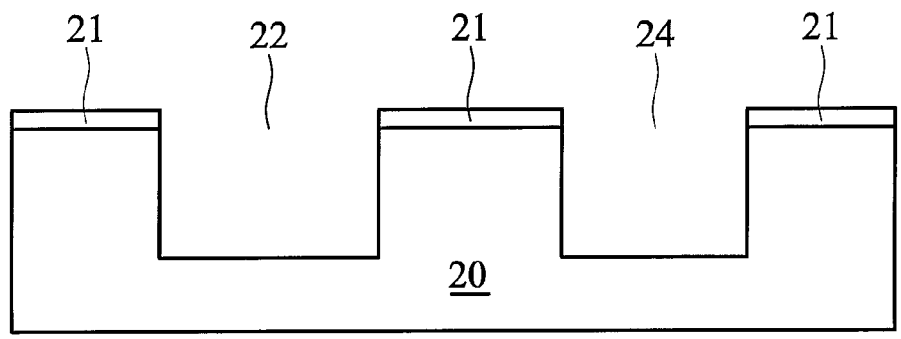
FIGS. 2 through 7C are cross-sectional views of intermediate stages in the manufacturing of a preferred embodiment.

FIGS. 2 through 7C are cross-sectional views of intermediate stages in the making of a preferred embodiment of the present invention. FIG. 2 illustrates the formation of trenches 22 and 24 in a dielectric layer 20. In the preferred embodiment, dielectric layer 20 is an inter-metal dielectric (IMD) layer with a dielectric constant (k value) lower than about 3.5. Low-k dielectric layer 20 preferably contains nitrogen, carbon, hydrogen, oxygen, fluorine, and combinations thereof. The exemplary materials include un-doped silicate glass (USG), fluorinated silica glass (FSG), and the like. Furthermore, the k value of low-k dielectric layer 20 may be lower than about 2.5 (hence referred to as an extremely low-k dielectric layer).

A dielectric layer 21, which acts as a chemical mechanical polish (CMP) stop layer, is formed on dielectric layer 20. Preferably, CMP stop layer 21 comprises a material selected from silicon nitride, silicon oxynitride, oxides, carbon-doped oxides, tetra-ethyl-ortho-silicate (TEOS), and combinations thereof. The preferred formation method is plasma enhanced chemical vapor deposition (PECVD). However, other commonly used methods such as high-density plasma CVD (HDPCVD), atomic layer CVD (ALCVD), and the like can also be used. In an exemplary embodiment wherein CMP stop layer 21 comprises silicon nitride or silicon carbide, the formation is preferably performed in a chamber in which gaseous precursors such as silane ($SiH_4$) and ammonia ($NH_3$) are introduced for a chemical reaction.

Figure 3:
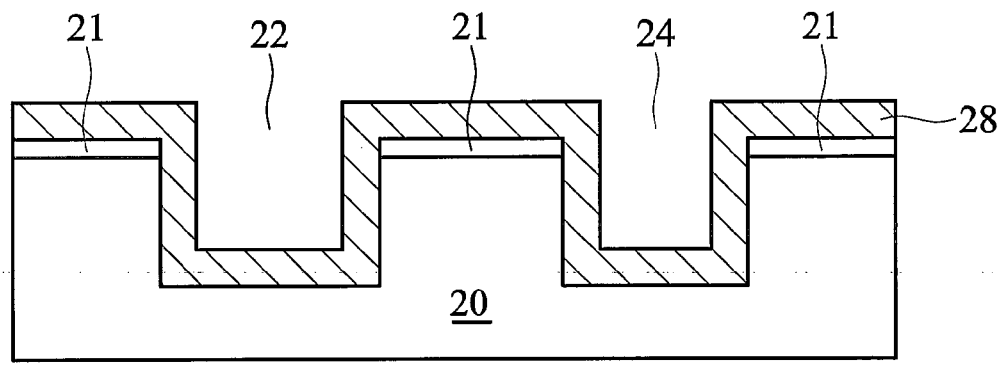

FIG. 3 illustrates a blanket formation of a diffusion barrier layer 28, which covers the sidewalls and bottoms of trenches 22 and 24. Diffusion barrier layer 28 is preferably formed of a material comprising titanium, titanium nitride, tantalum, tantalum nitride, ruthenium, ruthenium nitride, titanium compound, tantalum compound, and combinations thereof. The preferred formation methods include physical vapor deposition (PVD), atomic layer deposition (ALD), and other commonly used methods.

Figure 4:
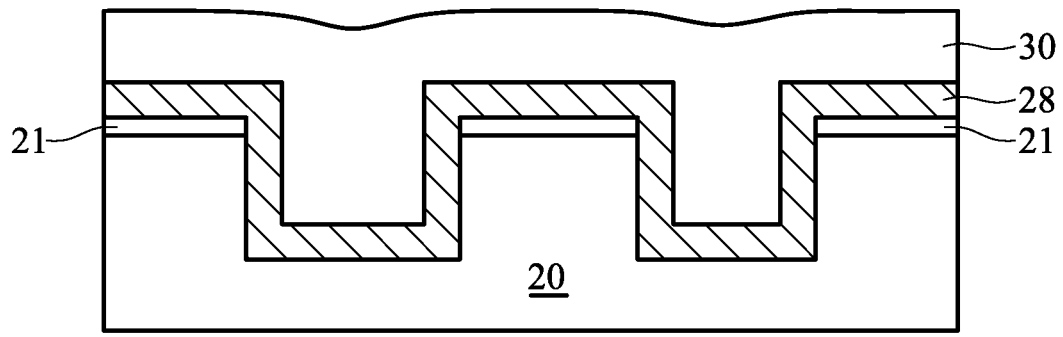

Referring to FIG. 4, a seed layer (not shown), which preferably includes copper or copper alloys, is formed on diffusion barrier layer 28. A conductive material 30 is then filled into trenches 22 and 24, preferably using plating. Conductive material 30 preferably comprises copper or copper alloys, although other materials such as aluminum, tungsten, silver, and combinations thereof, can also be used.

Figure 5:
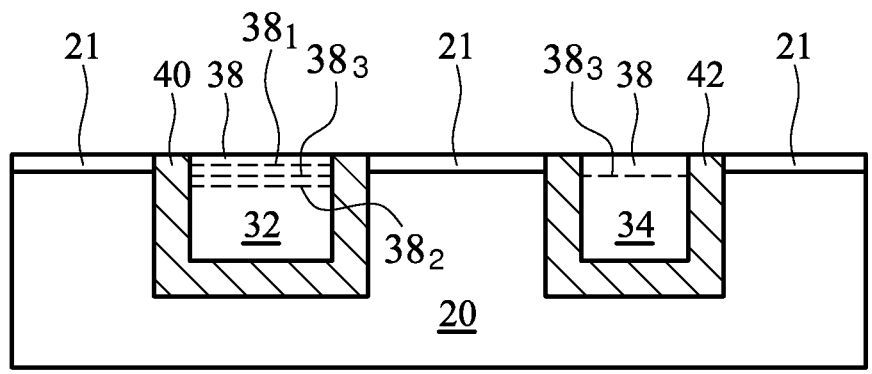

Referring to FIG. 5, a CMP is performed to remove excess materials, and the top surface of the conductive material 30 is reduced until level with a top surface of low-k dielectric layer 20 (or a top surface of CMP stop layer 21 if it exists). In the case where CMP stop layer 21 exists, the CMP stops at CMP stop layer 21. As a result, diffusion barrier layers 40 and 42 and conductive lines 32 and 34 are formed. Throughout the description, conductive lines 32 and 34 are alternatively referred to as copper lines 32 and 34 although they may include other conductive materials.

Figure 5A:
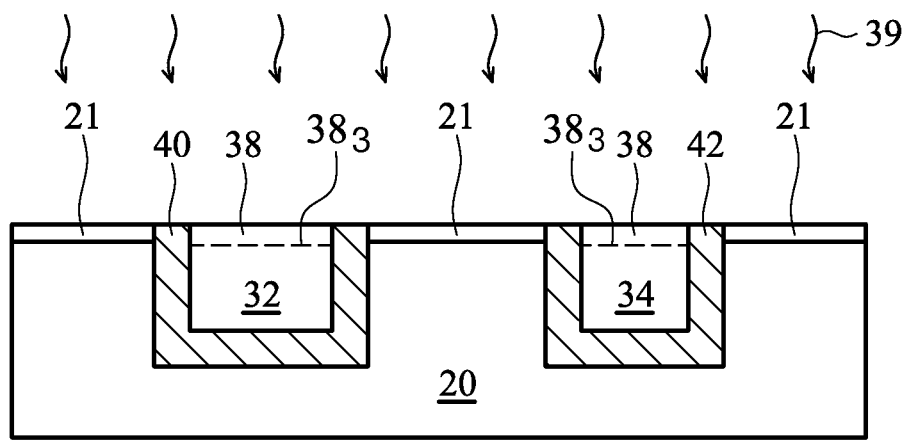
Figure 6A:
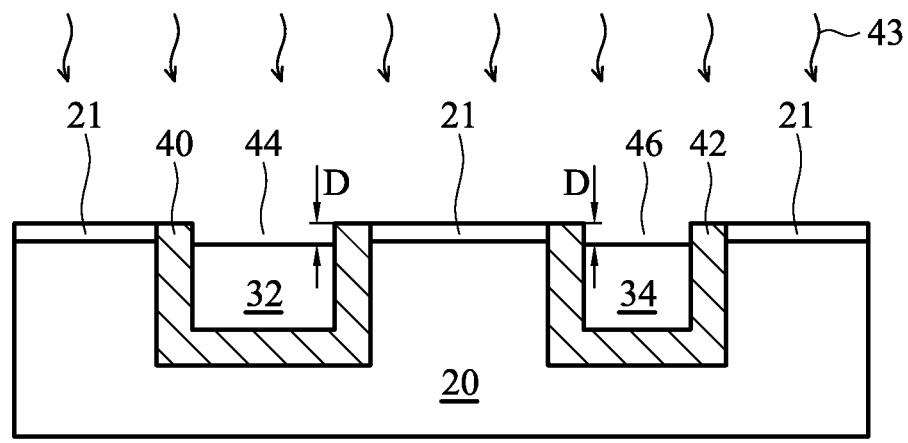
Figure 6B:
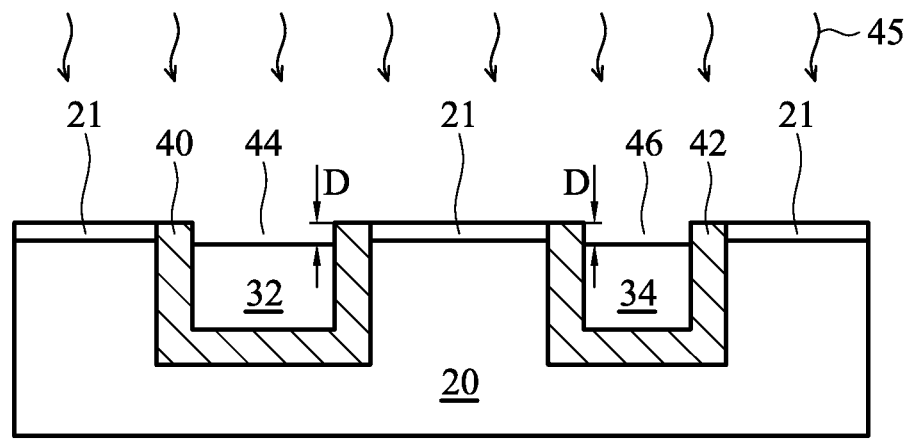

Referring to FIGS. 6A and 6B, copper lines 32 and 34 are preferably recessed to form recesses 44 and 46, which preferably have a depth of between about 100 Å and about 300 Å, and more preferably between about 100 Å and about 200 Å. Typically, after the CMP process, the top surface of copper lines 32 and 34 tend to have a natural copper oxide layer 38 (refer to FIG. 5) due to the exposure of the copper lines in an oxygen-containing environment. Copper oxide layer 38 is then removed using an acid and thus recesses 44 and 46 are formed. The thickness of the naturally formed surface copper oxide layer 38, however, may be greater than or less than the desired depth of the recesses. When a thickness (see, e.g., dotted line $38_1$) of the copper oxide layer 38 is less than a desired thickness (see, e.g., dotted line $38_3$), this thickness is increased preferably by oxidizing 39 (see FIG. 5A) metal lines 32 and 34 in an oxygen-containing environment, for example, in a plasma chamber, using oxygen plasma or downstream plasma. Copper oxide layer 38 is then removed in a wet cleaning process 43 (see FIG. 6A), for example, using $H_2SO_4$, citric acid and a wetting agent. This embodiment (forming copper oxide layer 38, and then removing oxide layer 38) is advantageous over the method of directly etching metal lines 32 and 34 to form recesses. The reason is the thickness of oxide layer is more controllable, as after an oxide layer having certain thickness is formed, the process for further oxidizing underlying metal lines 32 and 34 will be slowed down due to the fact that oxygen atoms/ions now need to penetrate the oxide layer before they can reach metal lines 32 and 34.

Figure 5B:
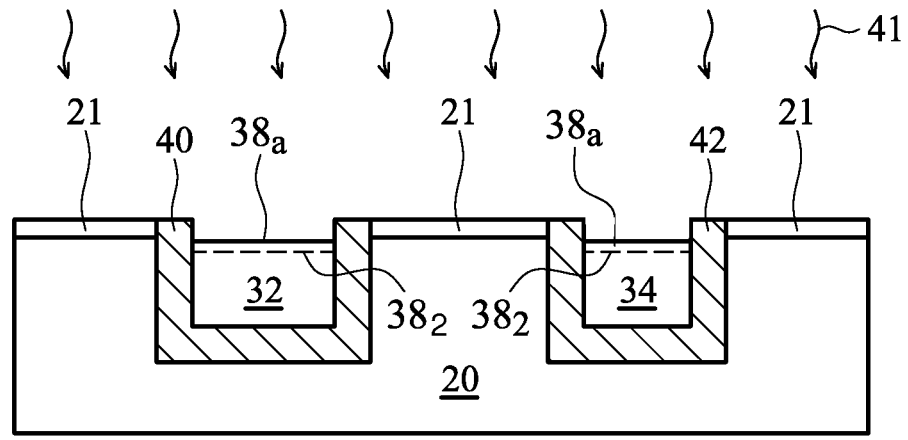

Conversely, if a thickness (see, e.g., dotted line $38_2$) of copper oxide layer 38 is greater than the desired thickness (see, e.g., dotted line $38_3$), only an upper portion of the copper oxide layer 38 is removed 41 (see FIG. 5B), and the lower portion 38a of copper oxide layer 38 is reduced 45 (see FIG. 6B) to copper. The reduction process may also be performed as a cleaning process to remove naturally formed copper oxide. As is known in the art, the sheet resistance of copper lines 32 and 34 is proportional to their heights. Therefore, it is undesirable to recess copper lines 32 and 34 too much as to cause a reduction in the sheet resistance. A reduction reaction is thus performed to reduce the remaining oxide to copper. The reduction reaction is preferably performed in a reduction solution using either an electroless method or an electrolytic method.

For the electroless reduction, the reduction solution preferably includes a cyclic borane compound. Examples of such cyclic borane compounds include morpholine borane, piperidine borane, pyridine borane, piperazine borane, 2,6-lutidine borane, N,N-diethylaniline borane, 4-methylmorpholine borane, 1,4-oxathiane borane, and combinations thereof. In other embodiments, reduction solutions include, but are not limited to, dimethylaminoborane (DMAB), diethylaminoborane, morpholine borane, and combinations thereof. In yet other embodiments, reduction solutions may include ammonium, alkali, alkaline earth metal borohydrides, hypophosphites, sulfites, bisulfites, hydrosulfites, metabisulfites, dithionates, tetrathionates, thiosulfates, thioureas, hydrazines, hydroxylamines, aldehydes (including formaldehyde and glyoxal), glyoxylic acid, reducing sugars, and combinations thereof.

Alternatively, the reduction action may be performed using an electrolytic method by applying an electric current, wherein the reduction of copper oxide to metallic copper is performed in an alkaline-based solution containing, for example, LiOH or KOH.

Figure 7A:
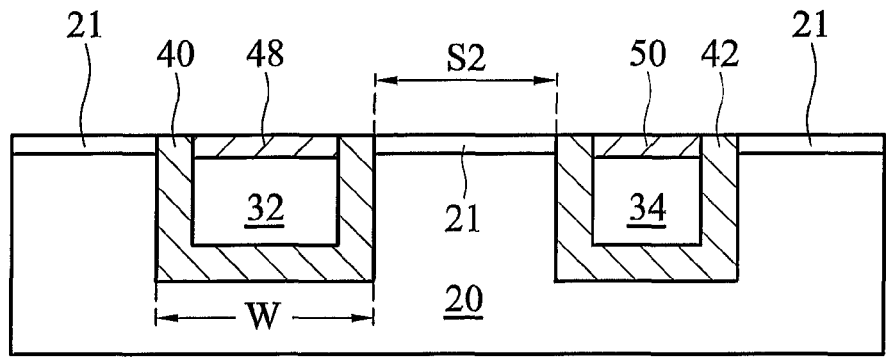

FIG. 7A illustrates metal caps 48 and 50 formed on conductive lines 32 and 34, respectively. The metal caps 48 and 50 preferably comprise materials such as cobalt, nickel, tungsten, molybdenum, silicon, zinc, chrome, boron, phosphorus, nitrogen, and combinations thereof. Metal caps 48 and 50 may also be composite layers comprising more than one layer, wherein each of the layers includes one or more of the above-discussed materials. The preferred thickness of metal caps 48 and 50 is preferably between about 25 Å and about 250 Å, and more preferably between about 100Å and about 200 Å.

In the preferred embodiment, metal caps 48 and 50 are formed by electroless plating and are selectively formed only on exposed surfaces of copper lines 32 and 34, respectively. One advantageous feature of selective formation of metal caps 48 and 50 is that top surfaces of metal caps 48 and 50 may be deposited higher, level with, or lower, than the respective diffusion barrier layers 40 and 42, depending on the design preferences. Electroless plating is preferably performed, for example, by using a plating liquid containing cobalt ions, a complexing agent, a pH buffer, a pH adjusting agent, and an alkylamine borane as a reducing agent. Depending on the preferred composition of metal caps 48 and 50, the plating liquid may further contain refractory (high-melting point) metals such as tungsten ions or molybdenum ions. The cobalt ions contained in the plating liquid may be supplied from a cobalt salt, for example, cobalt sulfate, cobalt chloride or cobalt acetate. Other desired components preferred in metal caps 48 and 50 are also included in the plating liquid in the form of ions. The structure formed in the previously discussed steps is submerged in the plating liquid, wherein the temperature of the plating liquid is preferably in a range of between about 30° C. and about 90° C.

In the preferred embodiment, metal caps 48 and 50 are selectively formed only on the respective copper lines 32 and 34, but not on top edges of diffusion barrier layers 40 and 42 and dielectric layer 20. This may be achieved by using a non-palladium catalyst, thus enabling a direct electroless plating. In other embodiments, metal caps 48 and 50 can be formed by depositing a metal cap layer using common techniques such as PVD, sputtering, and ALD, and then etching the metal cap layer to form metal caps 48 and 50.

During the formation of metal caps 48 and 50, due to process variations, a small amount of metal cap materials may be undesirably formed on top edges of diffusion barrier layers 40 and 42, and thus a post-cap cleaning is performed to remove undesired portions. For example, an etching process may be performed to remove portions of metal caps 48 and 50 on barrier layers 40 and 42, so that only the portions in the recesses are left. Alternatively, a CMP process may be performed.

Figure 7B:
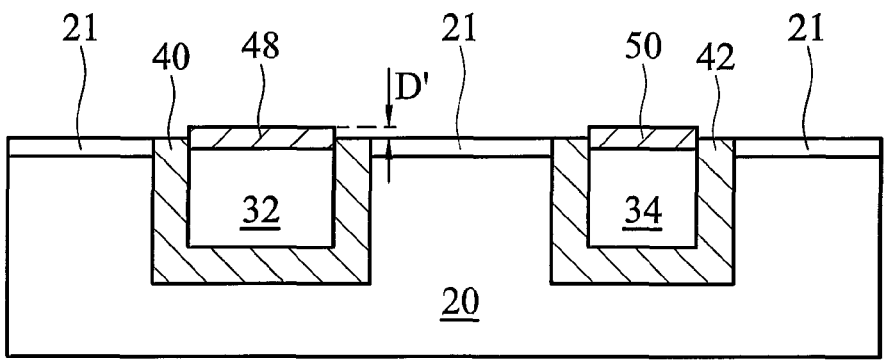
Figure 7C:
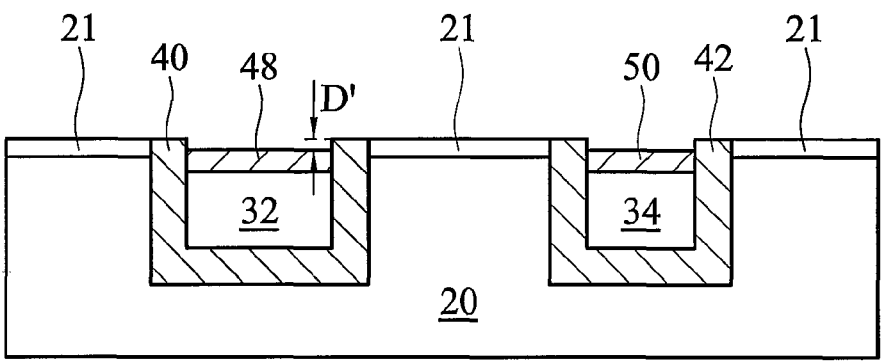

In the preferred embodiment, in order to achieve the optimum results, the top surfaces of metal cap layers 48 and 50 are leveled with the top edges of the diffusion barrier layers 40 and 42 and the CMP stop layer 21 (or the top surface of low-k dielectric layer 20 if no CMP stop layer 21 is formed). However, the top surfaces of metal caps 48 and 50 may be higher or lower than the top surfaces of the diffusion barrier layers 40 and 42, as is illustrated in FIGS. 7B and 7C. The difference D' is preferably less than about 50 Å.

As is known in the art, leakage currents and parasitic capacitance are more significant when the copper lines are close to each other. The preferred embodiments are therefore preferably used for dense patterns. For example, if the spacing S2 (refer to FIG. 7A) is less than about 0.9 μm, and more preferably less than about 0.4 μm, and even more preferably less than about 0.2 μm, the preferred embodiment is applied. Alternatively, the decision of whether to apply the preferred embodiment is determined by the relative spacing. If a ratio of spacing S2 to a width W of the copper line (including diffusion barrier layer 40) is less than about 10, the preferred embodiment is preferably applied. If the ratio is less than about one, the preferred embodiment is more preferably used. On the other hand, if the ratio is greater than about 10, whether to apply the process of the present invention is a design decision, and other factors such as cost may be taken into account.

Figure 8:
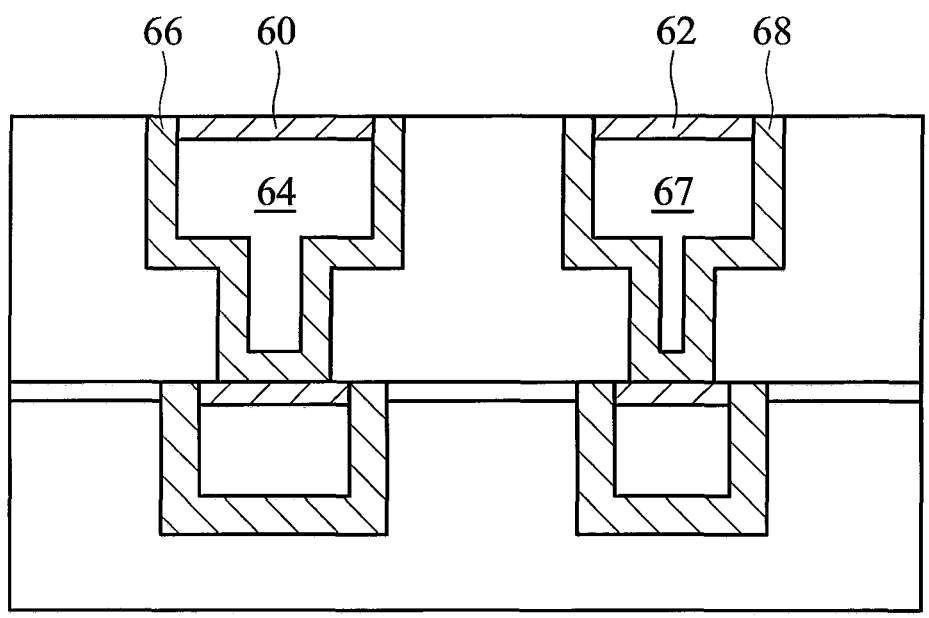
FIG. 8 illustrates a dual damascene structure embodiment of the present invention.

In the embodiments provided in the preceding paragraphs, a single damascene process is discussed to explain the concepts of the preferred embodiment. One skilled in the art will realize that the teaching is readily available for dual damascene processes. FIG. 8 illustrates an interconnect structure comprising dual damascene structures. Similarly, in this embodiment, metal caps 60 and 62 are preferably formed only on respective copper lines 64 and 67, but not the diffusion barrier layers 66 and 68. One skilled in the art will realize the corresponding formation steps.

By using the preferred embodiments of the present invention, both the parasitic capacitances and leakage currents of the interconnect structures can be reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:
   forming a first recess in a dielectric layer, the first recess extending from a top surface of the dielectric layer into the dielectric layer;
   forming a diffusion barrier layer in the first recess, the diffusion barrier layer comprising portions covering sidewalls of the first recess;
   forming a conductive line over the diffusion barrier layer in the first recess, and once the conductive line is formed, the diffusion barrier layer does not cover the top surface of the dielectric layer;
   recessing a top surface of the conductive line, the recessing being performed at least in part by removing a portion of an oxide layer from the top surface of the conductive line, the recessing forming a second recess;
   reducing, after the recessing, remaining portions of the oxide layer on the top surface of the conductive line to a conductive material; and
   selectively depositing a metal cap on the conductive line within the second recess and only within a region directly over the conductive line, wherein the metal cap has a top surface higher or lower than a top edge of at least one of the portions of the diffusion barrier layer covering the sidewalls of the first recess.

2. The method of claim 1, wherein the step of recessing the top surface of the conductive line comprises:
   oxidizing the top surface of the conductive line to form the oxide layer.

3. The method of claim 1, wherein the step of selectively depositing the metal cap comprises using electroless plating.

4. The method of claim 3, wherein the electroless plating is free from palladium catalysts.

5. The method of claim 1, wherein the diffusion barrier layer has a spacing from an additional diffusion barrier layer of an adjacent line, and wherein a ratio of the spacing to a combined width of the conductive line and the diffusion barrier layer is less than about one.

6. The method of claim 1, wherein the conductive line comprises copper, and the oxide layer comprises copper oxide.

7. A method of forming an integrated circuit, the method comprising:
   forming a chemical mechanical polish (CMP) stop layer on a dielectric layer;
   forming a first recess extending from a top surface of the dielectric layer into the dielectric layer;
   forming a diffusion barrier layer in the first recess and covering sidewalls of the first recess;
   forming a conductive material in the first recess;
   planarizing the conductive material to form a conductive line in the first recess, such that a top edge of the diffusion barrier layer is level with a top surface of the CMP stop layer;
   oxidizing a top layer of the conductive line to form an oxide layer;
   removing a portion of the oxide layer to recess the conductive line from the top surface of the dielectric layer, wherein after removing the portion of the oxide layer, remaining portions of the oxide layer form a remaining oxide layer;
   reducing, after the removing, at least a portion of the remaining oxide layer on a top surface of the conductive line to the conductive material; and
   after removing the portion of the oxide layer to recess the conductive line, forming a metal cap on the conductive line, wherein the metal cap has a top surface higher or lower than the top edge of the diffusion barrier layer.

8. The method of claim 7, wherein the first recess is formed through the CMP stop layer.

9. The method of claim 7, wherein the metal cap is formed using electroless plating with palladium-free catalysts, and wherein the metal cap is only within a region directly over the conductive line.

10. The method of claim 7, wherein after the step of planarizing the conductive material, horizontal portions of the diffusion barrier layer on the top surface of the CMP stop layer are removed.

11. The method of claim 7, wherein the step of reducing is performed in a reduction solution comprising a cyclic borane compound selected from the group consisting essentially of morpholine borane, piperidine borane, pyridine borane, piperazine borane, 2,6-lutidine borane, N,N-diethylaniline borane, 4-methylmorpholine borane, and 1,4-oxathiane borane, and combinations thereof, and wherein the reduction solution further comprises a reducer selected from the group consisting essentially of dimethylaminoborane (DMAB), diethylaminoborane, morpholine borane, and combinations thereof.

12. The method of claim 7, wherein the reducing is performed in a reduction solution comprising a reducer selected from the group consisting essentially of ammonium, alkali, alkaline earth metal borohydrides, hypophosphites, sulfites, bisulfites, hydrosulfites, metabisulfites, dithionates, tetrathionates, thiosulfates, thioureas, hydrazines, hydroxylamines, aldehydes (including formaldehyde and glyoxal), glyoxylic acid, reducing sugars, and combinations thereof.

13. The method of claim 7, wherein the reducing is performed by applying a current in an alkaline-based solution.

14. A method of forming an integrated circuit, the method comprising:
   forming a recess extending from a top surface of a dielectric layer into the dielectric layer;
   forming a diffusion barrier layer in the recess and on sidewalls of the recess;
   forming a conductive line over the diffusion barrier layer and in the recess;
   recessing a top surface of the conductive line, the recessing being performed at least in part by removing a portion of an oxide layer from the top surface of the conductive line;
   reducing, after the recessing, remaining portions of the oxide layer on the top surface of the conductive line; and
   forming a metal cap on the conductive line using a selective deposition method, wherein the metal cap is only formed within a region directly over the conductive line, and wherein the metal cap has a top surface higher or lower than a top edge of the diffusion barrier layer.

15. The method of claim 14, wherein the conductive line comprises copper, and the oxide layer comprises copper oxide.

16. The method of claim 14 further comprising removing the diffusion barrier layer from the top surface of the dielectric layer, the recessing the top surface of the conductive line being after the removing the diffusion barrier layer from the top surface of the dielectric layer.

* * * * *